United States Patent [19]

Leonowich et al.

[11] Patent Number: 5,040,193
[45] Date of Patent: Aug. 13, 1991

[54] RECEIVER AND DIGITAL PHASE-LOCKED LOOP FOR BURST MODE DATA RECOVERY

[75] Inventors: Robert H. Leonowich; Jeffrey L. Sonntag, both of Muhlenberg Township, Berks County, Pa.

[73] Assignee: AT&T Bell Laboratories, Murray Hill, N.J.

[21] Appl. No.: 387,205

[22] Filed: Jul. 28, 1989

[51] Int. Cl.$^5$ ............................................. H04L 27/22
[52] U.S. Cl. ........................................ 375/87; 341/70
[58] Field of Search ................... 375/55, 87, 18, 110; 341/70; 455/608, 617, 619

[56] References Cited

U.S. PATENT DOCUMENTS

| | | | |
|---|---|---|---|
| 4,292,626 | 9/1981 | Smithlin | 341/70 |
| 4,361,895 | 11/1982 | Khoudari | 375/87 |
| 4,525,848 | 6/1985 | Simpson | 375/87 |
| 4,562,582 | 12/1985 | Tokura et al. | 455/608 |
| 4,567,604 | 1/1986 | Jacksier | 375/87 |
| 4,578,799 | 3/1986 | Scholl et al. | 375/87 |
| 4,603,322 | 7/1986 | Blair | 341/70 |
| 4,606,053 | 8/1986 | Schroder | 375/55 |
| 4,805,197 | 2/1989 | Van Der Jagt et al. | 375/87 |
| 4,862,482 | 8/1989 | Patchen | 375/87 |

OTHER PUBLICATIONS

"Encoding Schemes in Serial Data Communications", *Electronic Engineering,* Jul. 1981, pp. 117 through 127.
"A CMOS Ethernet Serial Interface Chip", *1984 IEEE International Solid-State Circuits Conference,* pp. 184 and 185.

*Primary Examiner*—Stephen Chin
*Attorney, Agent, or Firm*—S. W. McLellan

[57] ABSTRACT

A digital data receiver and digital phase-locked loop for providing rapid acquistion and decoding of burst mode data signals, such as Manchester encoded data, without ambiguity. A 180° phase mis-lock detector and phase connector is provided to eliminate any phase-lock ambiguities that may occur. The mis-lock detector utilizes a Manchester data violation detector to determine if the correct phase of sample clock from the digital phase-locked loop is being used for decoding the Manchester data. The digital phase-locked loop utilizes a digital delay line with multiple taps, the appropriate tap, corresponding to a desired phase of a reference clock, is selected as the optimal sample clock. A phase detector determines the difference in phase, measured by the number of taps of the delay line, between the sampling clock phase and the incoming data transitions. The difference is accumulated in an integrator to select the optimal sampling clock phase tap. The phase correction of the sample clock results from switching to a tap on the delay line opposite to the tap being used as the sample clock. Typically, only three data transitions are needed for phase lock.

5 Claims, 4 Drawing Sheets

RECEIVER AND DIGITAL PHASE-LOCKED LOOP FOR BURST MODE DATA RECOVERY

CROSS-REFERENCE TO RELATED APPLICATION

This application is related to co-pending patent application by J. L. Sonntag, titled "Differential Controlled Delay Element and Skew Correcting Detector", Ser. No. 07/387,458, and is assigned to the same assignee as this application.

BACKGROUND OF THE INVENTION

1. Field of the Invention

This invention relates to digital phase-locked loops in general and, more particularly, to digital phase-locked loops used in clock recovery of burst-mode data systems.

2. Description of the Prior Art

Digital communication systems typically operate as one of two types: continuous mode and burst-mode. The difference between continuous-mode and burst-mode is the continued presence of pulses, such as data or clock pulses, for the former and the presence of the pulses only when data is to be transmitted for the latter. With continuous pulses, synchronization between receiver and transmitter is relatively simple and straightforward, such as that used in digital channel banks for telephony applications. However, integrated services digital networks (ISDN) and local area networks (LAN) are mostly burst oriented, particularly where multiple users are on a common communication bus, such as coaxial cable "backbone". Since each transmitter transmits only when information is to be transferred, all receivers "listening" thereto must synchronize to the data burst and each burst will have a different phase and a slightly different frequency from the preceding burst. This makes each burst independent of any preceding burst, complicating the synchronization procedure and hardware for each receiver.

To receive data reliably, the incoming burst data signal is sampled and a decision is made based on that sample whether a "one" or "zero" was transmitted. The sampling must be done at the optimal time so that the received signal amplitude is at its maximum or minimum; i.e., the data signal is sampled when the opening of the eye diagram is the greatest. The sampling is in response to a sampled clock which is derived from the incoming data signal. Since the data signal is not present at all times in a burst-mode environment, in contrast with the continuous-mode communication system environment, the sample clock must have the correct phase and frequency before the arrival of the data. To do so, the transmitter sends a "preamble" to the data, the preamble consisting of a predetermined length of alternating "one"s and "zero"s, creating a clock signal which can be utilized to generate the proper sample clock. It is noted that this preamble serves no useful purpose other than synchronization; it is a penalty or overhead to the communication system and must be sent every time a burst of data is transmitted. Therefore, it is desirable to minimize the length of this preamble.

The most widely used means of acquiring the proper sample clock from the incoming data signal is an analog phase-locked loop (PLL). The phase-locked loop, such as that disclosed in "A CMOS Ethernet Serial Interface Chip" by Haung et al., 1984 ISSCC Digest, 13.1 pp. 184, 185, locks onto the transitions in the incoming preamble and maintains that condition throughout the reception of the data. However, because of the loop-filter portion of the PLL, the PLL takes many (e.g. 20 to 30) transitions of the signal in the preamble to acquire lock. Further, the phase of the clock signal from the PLL is not necessarily suitable for the sample clock. Due to the inherent nature of analog PLLs, there will be a phase difference between the incoming signal and the derived clock. Hence, additional circuitry is necessary to adjust the phase of the clock from the PLL to get the proper sample clock. Therefore, it is desirable to derive the proper sample clock from incoming burst data signal with a minimum number of transitions in the preamble, thereby allowing for a reduction in the length the preamble, and use a minimum of extra hardware.

SUMMARY OF THE INVENTION

These and other aspects of the invention are provided for generally by an apparatus (phase-locked loop) and method which phase-locks onto an incoming signal comprising: delay means, such as multiple, serially coupled digital delay elements, for delaying a reference clock in predetermined, substantially equal, phase steps and having multiple outputs with corresponding signals thereon corresponding to each phase step; phase detector, coupled to the multiple outputs of the delay means and responsive to the incoming signal, for providing an output indicating the relative phase difference between the input signal and the output signal of the phase-locked loop; filter means, responsive to the phase detector, for indicating which of the multiple outputs from the delay means is to be selected as an output signal from the phase-locked loop; and coupling means, such as a multiplexer, responsive to the output of the filter means, for coupling the delayed reference clock to the output of the phase-locked loop as the output signal thereof. The reference clock has substantially the same frequency as the input signal.

A further aspect of the invention is a method and an apparatus for ensuring that the correct phase of a clock signal is used to synchronize a Manchester encoded data receiver to the incoming data. The clock signal is generated by a clock recovery means, similar to the above-described phase-locked loop. This apparatus is characterized by a data violation detector means for indicating that a violation occurred in the received Manchester encoded data; and, a means for inverting the clock signal from the clock recovery means in response to the detection of a data violation.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
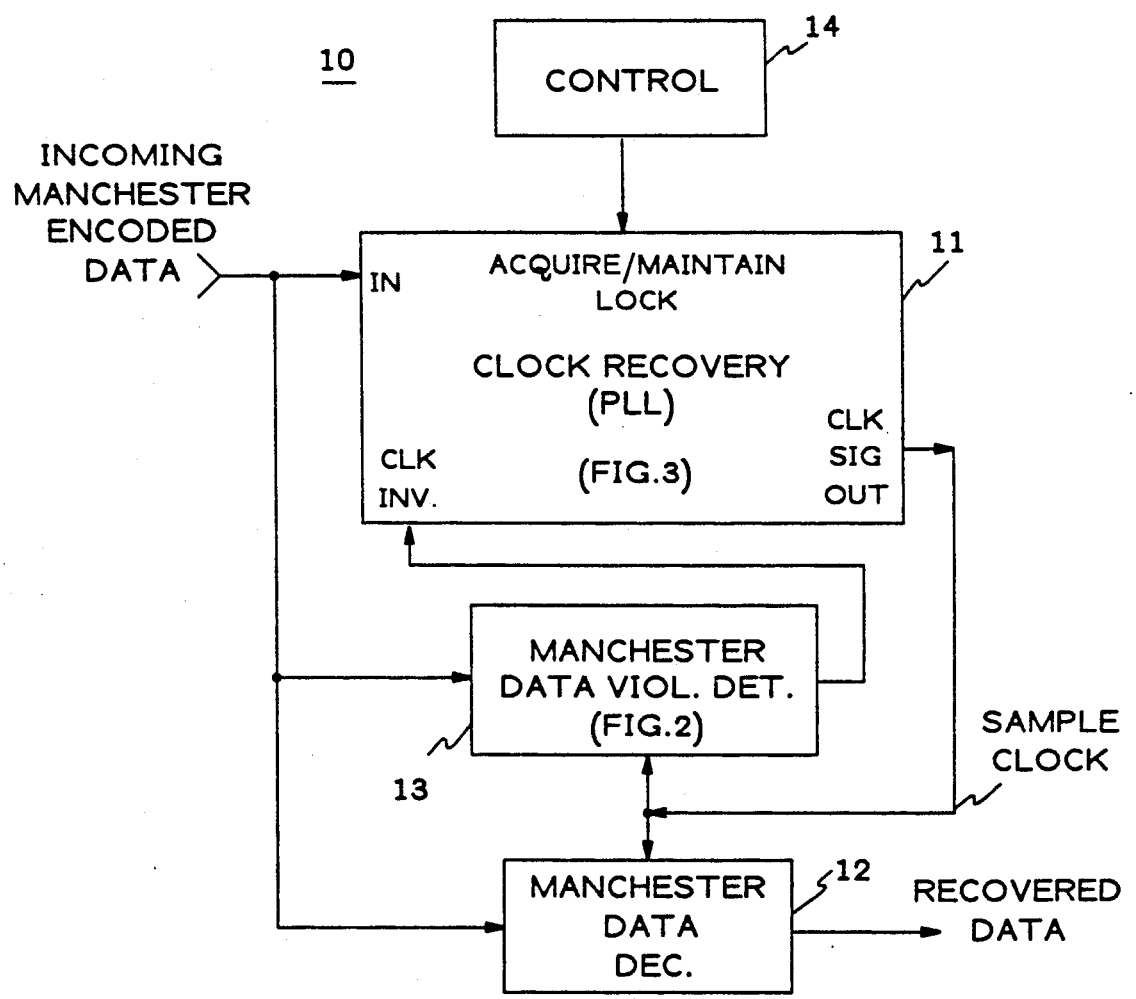
FIG. 1 is a diagram of a Manchester encoded data receiver according to another embodiment of the invention.

In FIG. 1, an exemplary Manchester encoded data receiver 10, according to one aspect of the invention, is diagramed. Manchester encoding of data, also known as bi-phase-level or split phase coding) is a method of combining a clock and a data signal in the transmitter thereof. It has the advantage of providing the necessary clock information for reliable decoding of the received data without extensive clock recovery apparatus and has no DC component in the transmitted data's spectrum. See "Encoding Schemes In Serial Data Communications", by L. Sanders, *Electronic Engineering*, July, 1981, pp. 117-127. For purposes here, Manchester encoding involves multiplying the data (non-return to zero, or NRZ data) to be transmitted by a clock signal having a frequency identical to that of the data.

Incoming data from an external source (not shown), such as a local area network or a magnetic disk head, drives a clock recovery circuit 11, a Manchester data detector 12, and a Manchester data violation detector 13. The external source does not typically provide continuous data; most communication systems employing Manchester coding are "bursty", i.e., packets of data are randomly transmitted having the data therein. Because of the data bursts or packets, a preamble is affixed to the beginning thereof to assist in the decoding, as described above.

Clock recovery circuit 11 will be discussed in more detail below, but for purposes here, it derives a clock signal for use in sampling (decoding) the Manchester encoded data by the Manchester data decoder 12 and the Manchester data violation detector 13. The clock recovery circuit 11 acquires the proper frequency and phase for the derived clock signal by locking onto the incoming data when commanded to do so by the control 14, typically during the preamble portion of a newly received burst of data. Thereafter, the clock recovery circuit 11 maintains lock on the incoming data for the duration of the received data burst. The clock recovery circuit 11 is essentially a phase-locked loop (PLL) and, for simplicity, will be herein referred to as a PLL.

The clock signal from the PLL 11 is used as the sample clock for the decoder 12 and the violation detector 13. However, the PLL 11 may not lock onto the proper phase of the incoming data; by nature of such PLL circuits 11, there is a small chance that it will astably, or falsely, "lock" 180 degrees out of phase. This ambiguity makes proper decoding of the Manchester encoded data by the decoder 12 substantially impossible. Therefore, the clock signal from the PLL 11 would be unsuitable as a sample clock for the decoder 12. It is noted that the Manchester data decoder 12 is typically a D-type flip-flop (not shown) sampling the incoming Manchester encoded data in response to the sample clock.

To ensure that the sample clock has the proper phase for use by the decoder 12, Manchester data violation detector 13 determines that, during the preamble portion of the data burst, if a data violation occurs, the clock signal is inverted by means for inverting the clock signal in the PLL 11, forcing the PLL 11 to lock onto the proper phase, as will be discussed in more detail below. Therefore, the proper phase of clock signal will be used as the sample clock by the decoder 12 during the decoding of the Manchester encoded data.

Figure 2:
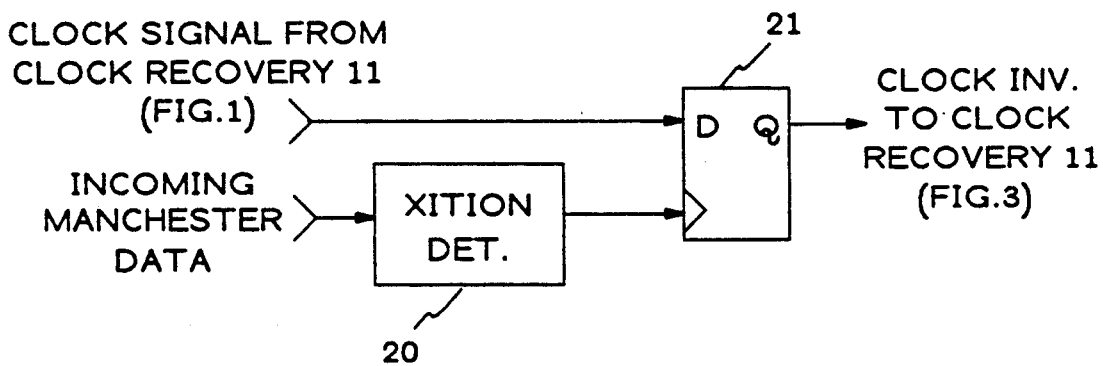
FIG. 2 is a diagram of an illustrative embodiment of the Manchester data violation detector of FIG. 1.

In FIG. 2, the Manchester data violation detector 13 is diagramed. Transition detector 20 detects transitions in the incoming Manchester encoded data preamble, generating a pulse which clocks D-type flip-flop 21. Flip-flop 21 samples the clock signal from the PLL 11 (FIG. 1) to determine if the clock signal has the proper phase. Should the phase be improper, the flip-flop 21 would be set, indicating that the clock signal should be inverted for use as the sample clock (FIG. 1). It is noted that the transition detector 20 generates a pulse only during the transitions in the incoming Manchester encoded data preamble.

Figure 3:
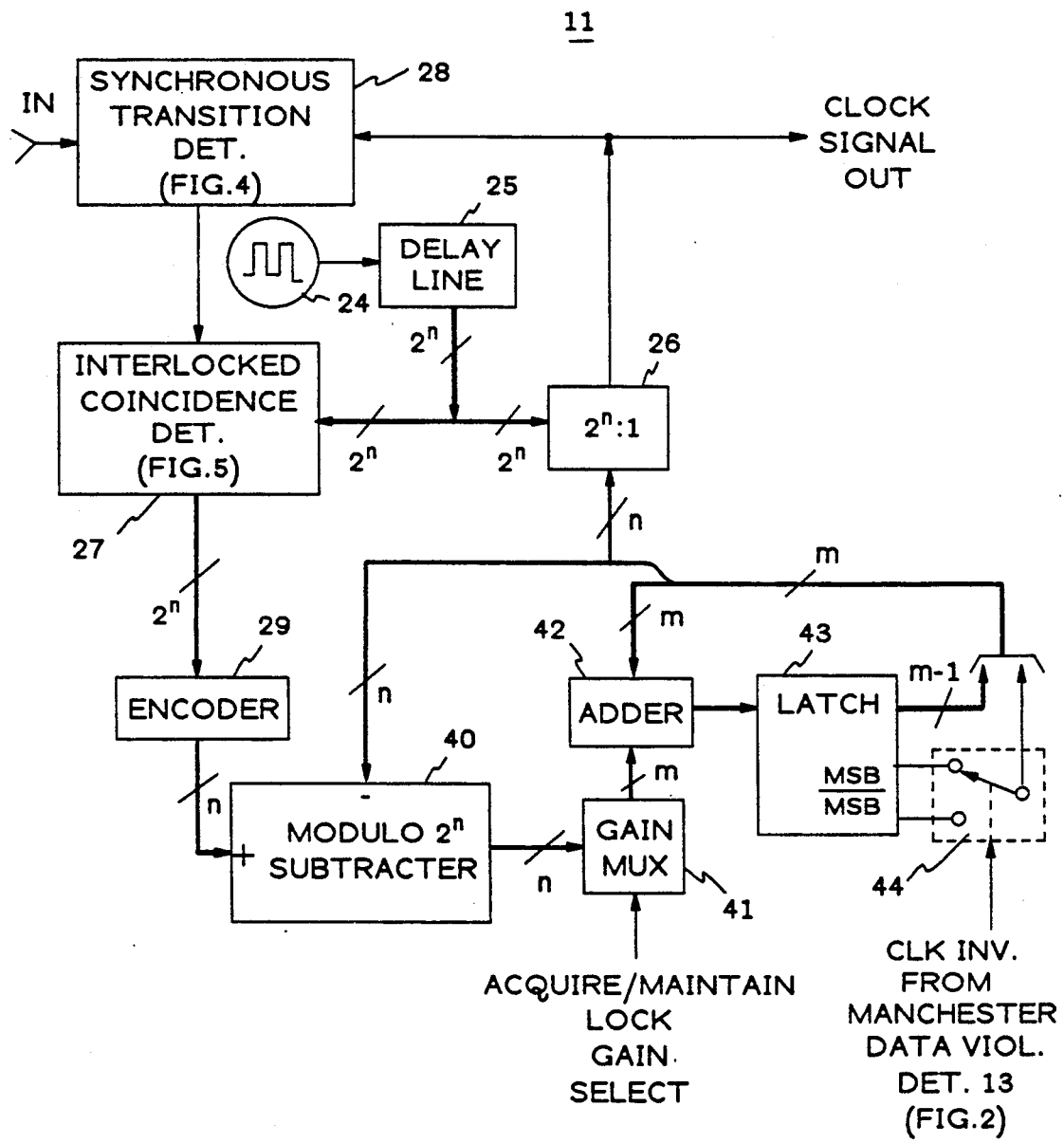
FIG. 3 is a diagram of the clock recovery circuit of FIG. 1 according to another embodiment of the invention.

The clock recovery circuitry (PLL) 11 of FIG. 1 is a diagramed in more detail in FIG. 3. It is noted that although the PLL 11 will be discussed in reference to deriving a clock signal for use in decoding Manchester encoded data, the PLL 11 may be used where ever a phase-locked loop function is desired. As shown, the PLL 11 comprises a delay means of delay line 25; a phase detector means of interlocked coincidence detector 27, synchronous transition detector 28, encoder 29 and subtractor 40; a filter means of gain multiplexer 41, adder 42, and later 43; and a coupling means of selector 26.

More specifically, a clock signal from reference clock 24 drives a delay line 25 having multiple taps as outputs to provide corresponding multiple phases of the reference clock signal, each phase signal differing from an adjacent phase signal by a predetermined phase difference. Preferably, there are $2^n$ taps or phases, the difference in phase between adjacent phase signals being such that the total difference is substantially 360° or T, where T is the clock period of the reference clock signal from clock 24. One such delay line is a plurality of serially coupled controlled delay elements, as disclosed in the above referenced concurrently filed patent application of J. L. Sonntag. However, there are many other ways of implementing this function, such as a ring oscillator synchronized to the reference clock 24.

It is preferable that the frequency of the reference clock 24 be substantially the same as the frequency of the input signal which the PLL 11 is to lock onto.

The $2^n$ phase signals are coupled to a $2^n:1$ selector (multiplexer) 26 for coupling a selected one of the phase signals to the clock signal output of the PLL 11 in response to an n-bit control word, as will be explained in more detail below. For purposes here, reference clock 24, delay line 25 and selector 26 forms a controlled oscillator, the phase of which being controlled or selected by the n-bit contol word. The $2^n$ phase signals are additionally coupled to an interlocked coincidence detector 27. Interlocked coincidence detector 27 will be explained in more detail below in connection with FIG. 5, but for purposes here, detector 27 indicates which of the phase signals coincide with transitions in an input signal as determined by a synchronous transition detector 28. The detector 28, responsive to an input signal that the PLL 11 is to lock onto, here the incoming Manchester encoded data of FIG. 1, generates an output when a mid-bit transition occurs in the incoming Manchester encoded data as defined by the clock signal. Detector 28 will be described in more detail below in reference to FIG. 4. Encoder 29 takes the coincidence pattern from the detector 27 and encodes it into an n-bit binary number (word) corresponding to the tap number of the delay line 25. Detectors 27, 28, encoder 29 and subtracter 40 (discussed infra) combined can be thought of as a phase detector in that the output of subtractor 40 is phase information relating to the relative phase difference between the clock signal output from selector 26 and the incoming data signal.

Figure 4:
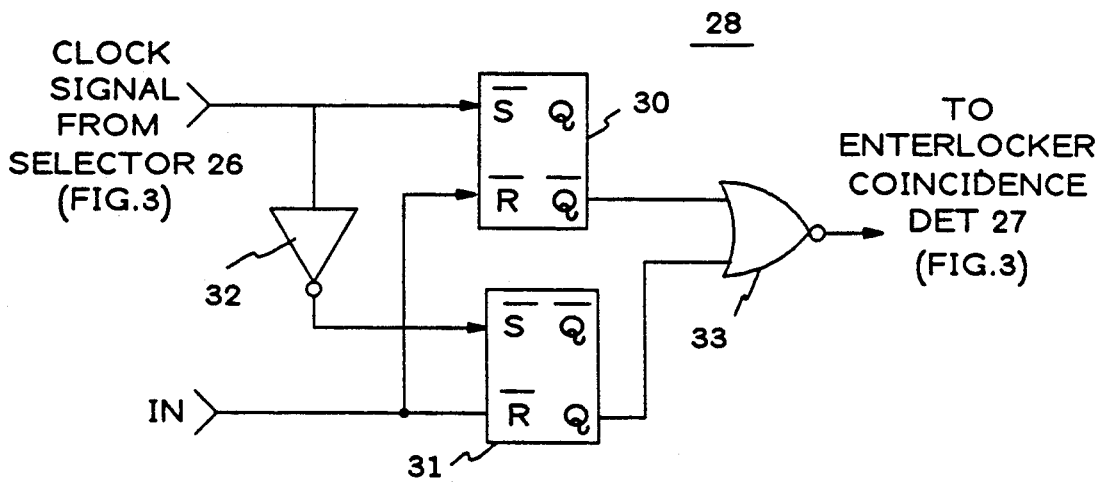
FIG. 4 is a diagram of the synchronous transition detector of FIG. 3.

Referring temporarily to FIG. 4, the synchronous transition detector 28 is diagramed. The input signal, in which a transition is to be detected, is coupled to the $\overline{S}$ input of set-reset type of flip-flop 30 and to the $\overline{S}$ input of set-reset type flip-flop 31 via inverter 32. Set-reset flip-flops 30, 31 are, for purposes here, comprised of cross-coupled NAND gates. The clock signal from the output of selector 26 (FIG. 3) is coupled to the $\overline{R}$ inputs to the flip-flops 30, 31. The $\overline{Q}$ (inverted) outputs of the flip-flops 30, 31 are combined by NOR gate 33 to produce the output for driving the detector 27 (FIG. 1). Briefly, operation of the detector 28 is as follows. While the clock signal is high and a rising edge of the input signal occurs, flip-flop 31 is set ($\overline{Q}$ is low), flip-flop 30 having been set while the input signal was low, whereby gate 33 asserts a high output. When the clock signal goes low, both the flip-flops 30, 31 are cleared, whereby gate 33 asserts a low output. If, however, while the clock signal is high a falling edge occurs in the input signal, then the functional description of flip-flops 30, 31 are reversed. It is noted that this implementation is exemplary and the function of the synchronous transition detector 28 may be implemented in many different ways.

Figure 5:
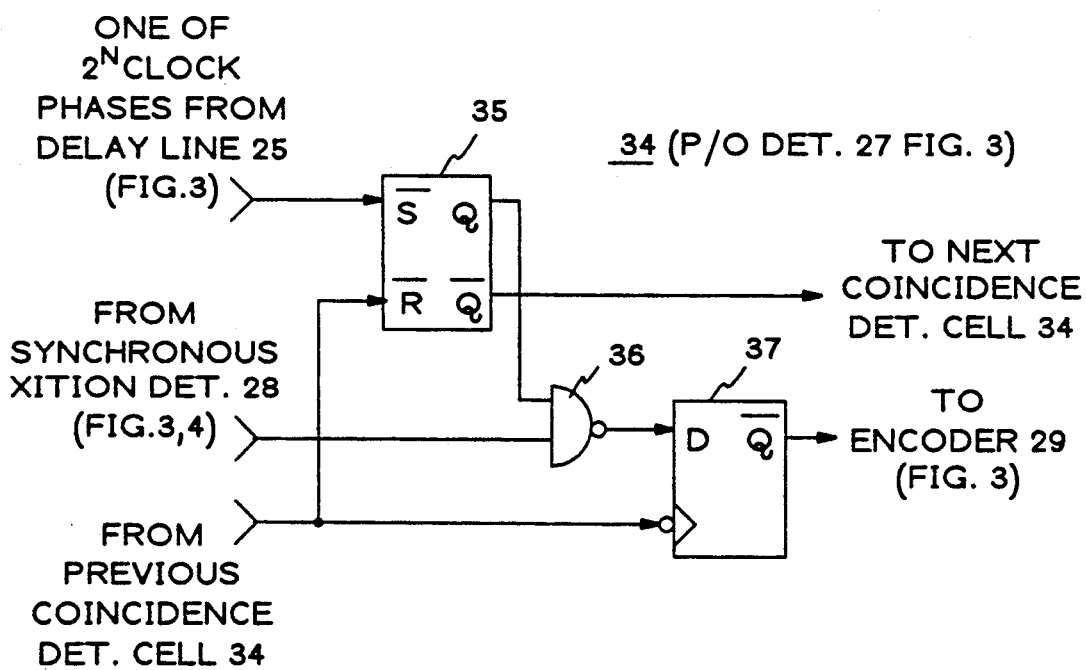
FIG. 5 is a diagram of one of the co-incidence detectors making up the inter-locked co-incidence detector of FIG. 3.

Referring temporarily to FIG. 5, one cell 34 of $2^n$ cells in the interlocked coincidence detector 27 (FIG. 3) is diagramed. Set-reset type flip-flop 35 has the $\overline{S}$ and $\overline{R}$ inputs thereof coupling to one of the $2^n$ clock phases from the delay line 25 (FIG. 1) and from the synchronous transition detector 28 (FIG. 3), respectively. The Q (true) output couples to one of two inputs of NAND gate 36 which in turn drives the data input of D-type flip-flop 37. The Q output of flip-flop 37 couples to the encoder 29 (FIG. 3). The $\overline{Q}$ (inverted) output of flip-flop 35 couples to the remaining input of NAND gate 36 of the subsequent cell 34. As will be explained below, the coupling of adjacent cells 34 allows for the simple encoding of coincidence between the transition in the incoming data and the multiple phases of the reference clock. Briefly, operation of the detector cell 34 is described herein. While the transition signal from the transition detector 28 (FIGS. 3 and 4) is low, flip-flop 35 is held reset, such that Q is low and $\overline{Q}$ is high. But once a transition has occurred in the incoming data, flip-flop 35 is released and set if the corresponding phase of the reference clock from delay line 25 (FIG. 3) is low or goes low while the flip-flop 35 is released. Should the flip-flop 35 be set, then the Q output goes high and $\overline{Q}$ goes low. The output of NAND gate 36 is low only if the flip-flop 35 is set and the flip-flop 35 of the previous cell 34 is not set. Otherwise, in all the remaining cells 34, the output of gate 36 is low. When the transition signal from the transition detector 28 (FIGS. 3 and 4) returns low, flip-flop 37 is clocked, loading therein the output of the gate 36. Hence, for all $2^n$ cells 34 making up the detector 27, only one output to the encoder 29 (FIG. 3) is low. This simplifies the encoding process by the encoder 29. Encoder 29 is of a conventional design, using exemplary NAND gates (not shown) to encode the $2^n$ inputs from the plurality of cells 34 of detector 27 (FIG. 3) into an n-bit binary word.

Returning to FIG. 3, the n-bit word from the encoder 29 is fed to a modulo-$2^n$ subtractor 40. Subtractor 40 is in reality an adder adapted to perform modulo-$2^n$ subtraction. Subtractor 40 subtracts from the n-bit number from the encoder 29 the n-bit number of the tap on delay line 25 selected as the clock signal output of the PLL 11 by selector 26. The resulting n-bit number represents the difference in phase (measured in the difference in the number of taps of the delay line 25) between the input signal to the synchronous transition detector 28 and the output clock signal. The n-bit word phase difference resulting from subtractor 40 drives gain multiplexer 41 which, in turn, drives an m-bit (m>n) adder 42 and latch 43. Gain multiplexer 41 will be explained in more detail below, but it is sufficient to state here that multiplexer 41 provides a multiplicative factor to the n-bit word from subtractor 40, by a predetermined shift of the bits, to provide the desired loop gain, that gain being dependent on whether the PLL 11 is acquiring lock or maintaining lock on the input signal. It is understood that any means of providing a weighting to the n-bit word from subtractor 40 can be used in place of multiplexer 41, such as a multiplier. Adder 42 and latch 43 are arranged to provide a conventional m-bit integrator responsive to the gain multiplexer 41. Of the m bits (m−1 bits plus the most significant bit, MSB) from the latch 43, the most significant n bits thereof are used as the n-bit control word for the selector 26 and are fed back to the subtracter 40. Hence, the n most significant bits from the latch 43 identify which tap of the delay line 25 is to be coupled to the output of the PLL 11 by selector 26. Alternatively, the n most significant bits of the latch 43 identify which phase of the delayed reference clock signal from the delay line 25 and reference clock 24 is to be used as the clock output signal. It is understood that a predetermine phase offset between the input signal and the output clock signal may be implemented by introducing an offset number to subtracter 40, the offset measured in the number of taps of the delay line as phase difference desired. The offset may be applied by suitably modifying the subtracter 40, by introducing an adder (not shown) in any of the n-bit signal paths shown coupling to or from the subtracter 40, preferably, or modifying encoder 29 to provide the desired offset.

The gain multiplexer 41 provides the desired loop gain for the PLL 11 depending on which state the PLL 11 is in. For the initial locking of the PLL 11 onto the input signal, the preferred gain is one-half, requiring only two transitions in the input signal to obtain lock. Once locked, much smaller gains are desirable to reduce the jitter (phase noise) transfer function of the PLL 11. In the "locked" mode, an exemplary gain of $2^{-5}$ is used. This works out to be a sign-extended one bit shift to the right of the n-bit word from the subtracter 40 when acquiring lock, or a sign-extended 5 bit shift to the right of the n-bit word when in lock. To implement this in an efficient manner, an m-bit multiplexer is employed (here a 10 bit multiplexer) which provides the desired shifts. Zeros are applied to those bits into the adder 42 not coupled by the multiplexer to the subtracter 40. Together, gain multiplexer 41, adder 42 and latch 43 forms a variable gain first order loop filter.

As described above in connection with FIG. 1, the clock signal is phase inverted by the PLL 11 when a Manchester data violation occurred during the preamble portion of the data packet. This function may be advantageously accomplished within the PLL 11 shown in FIG. 3. By inverting the most significant bit of the n-bit digital control word to selector 26, here by switch 44 selecting the inverted MSB ($\overline{\text{MSB}}$), the phase of the output clock signal will be inverted 180° since the inverting of the MSB has the effect of selecting the tap $2^n/2$, modulo $2^n$, taps away. Given that all $2^n$ taps span the entire 360° of a reference clock 24 period, then by moving half the number of taps yields a 180° phase change. Since the MSB is inverted only when the PLL 11 is in a false lock, the phase inversion will place the PLL 11 in or near the correct phase for the proper lock. Hence, no extra time will be required by the PLL 11 to re-lock.

As described above, in FIG. 1, a clock signal inverter 15 is shown to invert the phase of the clock signal from the PLL 11 when a Manchester data violation occurred during the preamble portion of the data packet. This function may be advantageously accomplished within the PLL 11 shown in FIG. 3. Although not shown in FIG. 3, by inverting the most significant bit of the n-bit digital control word to selector 26, the phase of the output clock signal will be inverted 180° since the inverting of the most significant bit has the effect of selecting the tap $2^n/2$, modulo $2^n$, taps away. Given that all $2^n$ taps span the entire 360° of a reference clock 24 period, then by moving half the number of taps yields a 180° phase change.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

We claim:

1. In a Manchester encoded data receiver, formed in an integrated circuit and having a clock recovery means for providing a clock signal used to synchronize the receiver to the incoming data or the preamble thereto, a Manchester code violation detector characterized by:

a transition detector, having an output, for indicating a transition in the received Manchester encoded preamble; and, a flip-flop, having a clock input coupled to the output of the transition detector, a data input with the clock signal thereon, and an output, for sampling the clock signal in response to the transition detector;

wherein the output of the flip-flop indicates if a Manchester code violation has occurred.

2. The Manchester receiver as recited in claim 1, wherein the clocked flip-flop is a D-type flip-flop.

3. The Manchester encoded data receiver as recited in claim 1, further characterized by a means for inverting the clock signal from the clock recovery means in response to the Manchester code violation detector.

4. A method of detecting a Manchester code violation in a Manchester data receiver, the receiver having a clock recovery means for providing a clock signal used to synchronize the receiver to incoming Manchester encoded data and the preamble thereto, characterized by the steps of:

generating a first signal in response to a transition in the received preamble;

applying the first signal to a clock input of a flip-flop, the flip-flop having an output;

sampling the clock signal, coupled to a data input of the flip-flop, in response to the transition in the received preamble;

wherein the output of the flip-flop indicates if a Manchester code violation has occurred.

5. The method as recited in claim 4, further characterized by:

inverting the clock signal from the clock recovery means in response to the detection of a Manchester code violation.

* * * * *